United States Patent
Kim et al.

(10) Patent No.: US 8,174,052 B2
(45) Date of Patent: May 8, 2012

(54) STANDARD CELL LIBRARIES AND INTEGRATED CIRCUIT INCLUDING STANDARD CELLS

(75) Inventors: Ha-Young Kim, Gyeonggi-do (KR); Sang-Jin Cheong, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 338 days.

(21) Appl. No.: 12/390,807

(22) Filed: Feb. 23, 2009

(65) Prior Publication Data

US 2009/0212327 A1     Aug. 27, 2009

(30) Foreign Application Priority Data

Feb. 26, 2008   (KR) .................. 10-2008-0017136

(51) Int. Cl.
*H01L 23/52* (2006.01)

(52) U.S. Cl. ........ 257/207; 257/202; 257/204; 257/206; 257/499

(58) Field of Classification Search .................. 257/202, 257/204, 206, 207, 499, E27.001; 716/1, 716/11

See application file for complete search history.

(56) References Cited

U.S. PATENT DOCUMENTS

| | | | |
|---|---|---|---|
| 6,818,929 B2 * | 11/2004 | Tsutsumi et al. | 257/204 |
| 6,938,226 B2 | 8/2005 | Nguyen et al. | |
| 7,129,562 B1 * | 10/2006 | Gheewala et al. | 257/574 |
| 2007/0033548 A1 * | 2/2007 | Tatsumi | 716/1 |

FOREIGN PATENT DOCUMENTS

| | | |
|---|---|---|
| KR | 1020000070614 | 11/2000 |
| KR | 1020010029851 | 4/2001 |

* cited by examiner

*Primary Examiner* — Zandra Smith
*Assistant Examiner* — Jamie C Niesz
(74) *Attorney, Agent, or Firm* — Myers Bigel Sibley & Sajovec (57) ABSTRACT

A standard cell library includes a first power rail, a second power rail, a third power rail, a first standard cell, and second standard cells. The first power rail extends in a first direction. The second power rail extends in the first direction, and is spaced apart from the first power rail by a predetermined spacing in a second direction perpendicular to the first direction. The third power rail extends in the first direction between the first power rail and the second power rail. The first standard cell has at least one cell having a first cell height, and is arranged between the first power rail and the second power rail. The second standard cells have at least two cells, each having a second cell height, that are in contact with each other in the second direction, and are in contact with the first standard cell in the first direction.

15 Claims, 7 Drawing Sheets

1st METAL LAYER

— M1

2nd METAL LAYER

— M2

SECOND DIRECTION(5)

FIRST DIRECTION(3)

STANDARD CELL LIBRARIES AND INTEGRATED CIRCUIT INCLUDING STANDARD CELLS

CROSS REFERENCE TO RELATED APPLICATION

This applications claims priority under 35 USC §119 to Korean Patent Application No. 10-2008-0017136, filed on Feb. 26, 2008 in the Korean Intellectual Property Office (KIPO), the disclosure of which is herein incorporated by reference in its entirety.

BACKGROUND

The present invention relates to semiconductor integrated circuits, and more particularly to standard cell libraries and integrated circuits including cells from standard cell libraries.

As sizes of integrated circuits (ICs) increase, semi-custom design schemes are generally adopted, because it may be difficult, expensive and/or time consuming to design all circuits manually. In semi-custom design schemes, a plurality of standard and basic cells are prepared in advance, and a desired circuit is developed by designing logic cells automatically using the standard cells by a computer. The standard cells may be stored, for example, in a standard cell library that is stored in a computer readable database. Accordingly, a standard cell library is a database of standard cell designs, or computer readable layout instructions, that define cell layouts that can be used by a designer to design a logic circuit. For example, a standard cell scheme may be used as one of the semi-custom design schemes. In the standard cell scheme, relatively complex logic circuits may be designed by combining the basic cells, and stored as standard cells in a database of the computer. In case of designing an IC, a desired IC may be implemented by combining the standard cells stored in the database. A plurality of cells having a same cell height may be arranged in a plurality of rows.

As the integration level of the IC increases, there is a need for reducing cell size. Generally, if the size of a transistor in each cell is reduced, it is possible to reduce the cell size. However, when sizes of all transistors of the cell are uniformly reduced, it may become more difficult to implement a desired function. In addition, when sizes of all transistors of the cell are uniformly reduced, a complexity of the lowest metal layer may increase, because a conventional standard cell usually uses only the lowest metal layer, and thus the effective cell size may increase rather than decrease.

SUMMARY

According to some embodiments, a standard cell library includes a first power rail, a second power rail, a third power rail, a first standard cell, and second standard cells. The first power rail extends in a first direction. The second power rail extends in the first direction, and is spaced apart from the first power rail by a predetermined spacing in a second direction perpendicular to the first direction. The third power rail extends in the first direction between the first power rail and the second power rail. The first standard cell has at least one cell having a first cell height in the second direction, and is arranged between the first power rail and the second power rail and is electrically connected to the third power rail. The second standard cells have at least two cells, each having a second cell height in the second direction. The second standard cells are in contact with each other in the second direction, and are in contact with the first standard cell in the first direction.

In some embodiments, the first standard cell may include a plurality of impurity regions and a plurality of poly gates.

The impurity regions may be formed apart from one another in regions under between the first and second power rails, and the poly gates may divide the impurity regions. At least one of the poly gates may pass under the third power rail. The impurity regions may be formed in flip configuration with respect to the third power rail. In some embodiments, the impurities regions may be formed in symmetric configuration with respect to the third power rail. The first standard cell may use a first metal layer for signal routing, wherein the first metal layer comprises a lowest metal layer in the standard cell library.

In some embodiments, each of the second standard cells may include a plurality of impurity regions and a plurality of poly gates. The impurity regions may be formed apart from one another in a region under between the first and third or second and third power rails, and the poly gates may divide the impurity regions.

In some embodiments, the first and second metal layers may be provided in a first metal layer, wherein the first metal layer comprises a lowest metal layer in the standard cell library.

In some embodiments, the third power rail may be provided in a second metal layer.

The third power rail may include a first portion over the first standard cell and a second portion over the second standard cells. The first portion may be provided in the second metal layer, and the second portion may be provided in the first metal layer.

In some embodiments, the first and second power rails may include a power supply rail, and the third power rail may include a ground rail.

In some example embodiments, the first and second power rails may include a ground rail, and the third power rail may include a power supply rail. According to some embodiments, a standard cell library includes at least one first standard cell having a first cell height and at least two second standard cells each having a second cell height. The standard cell library includes a first power rail, a second power rail, and a third power rail. The first power rail extends in a first direction. The second power rail extends in the first direction, and is spaced apart from the first power rail by a predetermined spacing in a second direction perpendicular to the first direction. The third power rail extends in the first direction between the first power rail and the second power rail. The first standard cell has at least one cell, has a first cell height, and is arranged under between the first power rail and the second power rail. The first cell height is defined by a spacing between the first and second power rails. The second standard cells have at least two cells, each having a second cell height. The second standard cells are in contact with each other in the second direction, and are in contact with the first standard cell in the first direction. The second cell height is defined by a spacing between the first and third power rails or by a spacing between the third and second power rails.

In some embodiments, the first power rail and the second power rail may be provided in a first metal layer, and the third power rail may be provided in a second metal layer that is higher than the first metal layer.

In some embodiments, the first power rail and the second power rail may be provided in a first metal layer, and the third power rail may include a first portion over the first standard cell and a second portion over the second standard cells. The first portion may be provided in a second metal layer that is higher than the first metal layer, and the second portion may be provided in the first metal layer.

According to some embodiments, an integrated circuit (IC) including at least one first standard cell having a first cell height and at least two second standard cells having, each having a second cell height. The first standard cell and the second standard cells may be formed on a substrate of the IC. The IC further includes a first power rail, a second power rail, and a third power rail. The first power rail extends in a first direction over the substrate. The second power rail extends in the first direction, and is spaced apart from the first power rail by a predetermined spacing in a second direction perpendicular to the first direction. The third power rail extends in the first direction between the first power rail and the second power rail. The first standard cell has at least one cell, has a first cell height, and is arranged under between the first power rail and the second power rail. The first cell height is defined by a spacing between the first and second power rails. The second standard cells have at least two cells, each having a second cell height, are in contact with each other in the second direction, and are in contact with the first standard cell in the first direction. The second cell height is defined by a spacing between the first and third power rails or by a spacing between the third and second power rails.

In some embodiments, the first and second power rails may include a power supply rail, and the third power rail may include a ground rail.

In some example embodiments, the first and second power rails may include a ground rail, and the third power rail may include a power supply rail.

In some embodiments, the first power rail and the second power rails may be provided in a first metal layer, and the third power rail may be provided in a second metal layer that is higher than the first metal layer.

In some embodiments, the first power rail and the second power rails may be provided in a first metal layer, and the third power rail may include a first portion over the first standard cell and a second portion over the second standard cells. The first portion may be provided in the second metal layer, and the second portion may be provided in the first metal layer.

Accordingly, the first metal layer may be used for signal routing without restriction by using the second metal layer for all or portion of the third power rail arranged between the first power rail and the second power rail.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION

Various example embodiments will be described more fully with reference to the accompanying drawings, in which some example embodiments are shown. The present invention may, however, be embodied in many different forms and should not be construed as limited to the embodiments set forth herein. Rather, these embodiments are provided so that this disclosure will be thorough and complete, and will fully convey the scope of the present invention to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

Figure 1:
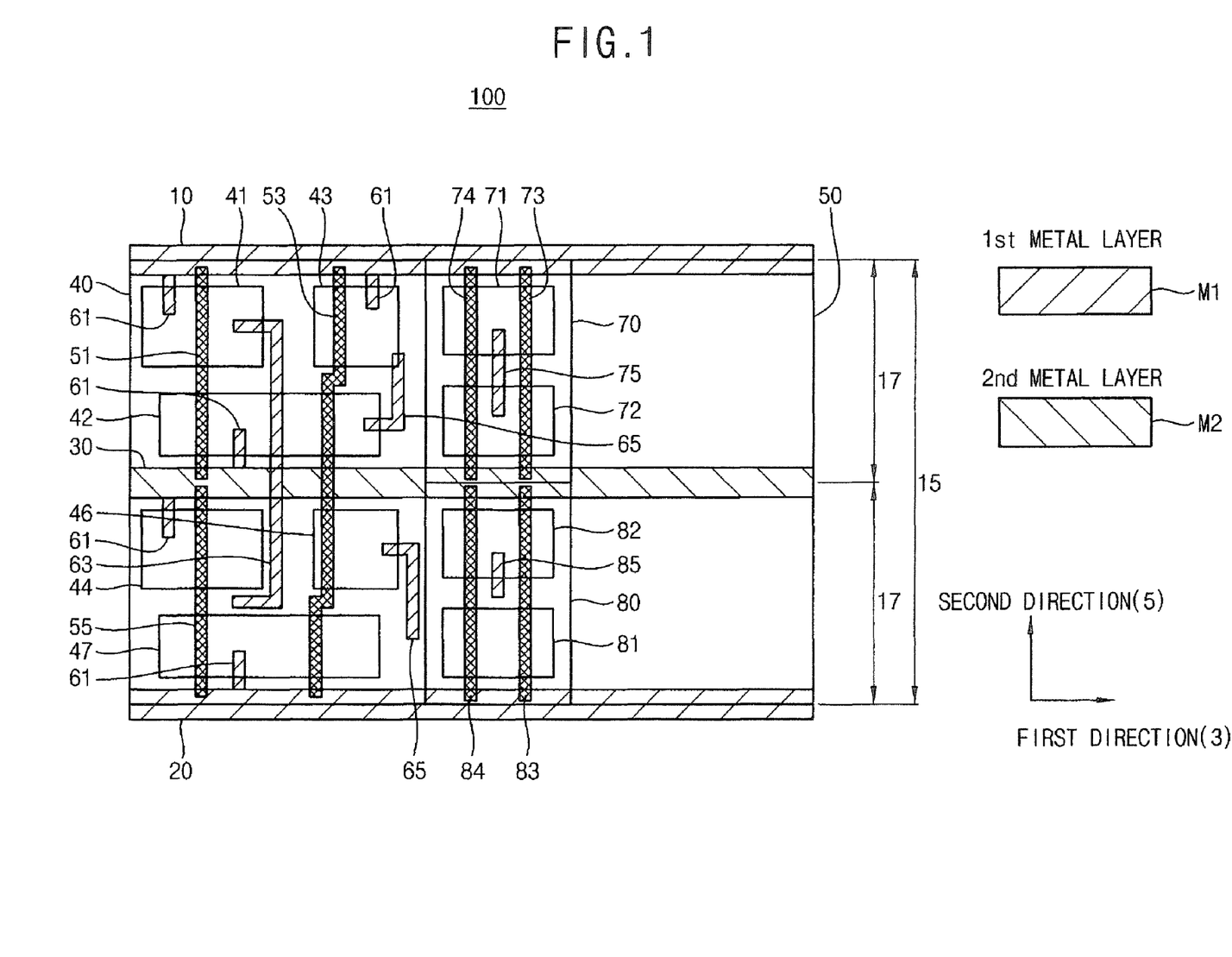
FIG. 1 illustrates a standard cell library according to some embodiments.

FIG. 1 illustrates a standard cell library according to some embodiments.

Referring to FIG. 1, a standard cell library 100 according to some embodiments includes a first power rail 10, a second power rail 20, a third power rail 30, first standard cells 40 and 50, and second standard cells 70 and 80.

The first power rail 10 extends in a first direction 3. The second power rail 20 extends in the first direction 3 and is spaced apart from the first power rail 10 by a predetermined spacing in a second direction 5. The second direction 5 is perpendicular to the first direction 3. The third power rail 30 extends in the first direction 3 between the first power rail 10 and the second power rail 20. In some embodiments, each of the first and second power rails 10 and 20 may be spaced apart from the third power rail 30 by the same spacing.

The first standard cell 40 is arranged between the first and second power rails 10 and 20, and the first standard cell 40 has a first cell height 15. The cell height indicates a horizontal length of the cell in the second direction 5. The second standard cells 70 and 80 are arranged between the first and second power rails 10, 20, and the second standard cells 70 and 80 are in contact with the first standard cell 40 in the first direction 3. The second standard cells 70 and 80 are in contact with each other in the second direction 5. The second standard cells 70 and 80 respectively have a second cell height 17. In some embodiments, each of the second standard cells 70 and 80 may have a cell height of seven tracks, and thus, the first standard cell 40 may have a cell height of fourteen tracks. The first standard cell 50 may be arranged in contact with the second standard cells 70 and 80 in the first direction 3.

The first standard cell 40 includes a plurality of impurity regions 41, 42, 43, 44, 46, and 47 that are formed apart from one another in a semiconductor substrate between the first and second power rails 10 and 20, and includes a plurality of poly gates 51, 53 and 55 that partition the impurity regions 41, 42, 43, 44, 46, and 47. The poly gate 53 may pass under the third power rail 30. Transistors (that is, combinations of a drain, a source and a gate forming a transistor) may be defined by the impurity regions 41, 42, 43, 44, 46, and 47 and the poly gates 51, 53 and 55. The first standard cell may further include interconnections 61, 63 and 65 for signal routing. The interconnection 61 may connect the power rails 10, 20 and 30 with the impurity regions 41, 42, 43, 44, 46, and 47, respectively, as illustrated in FIG. 1.

The second standard cell 70 includes impurity regions 71 and 72, poly gates 73 and 74, and an interconnection 75 for signal routing. The second standard cell 80 includes impurity regions 81 and 82, poly gates 83 and 84 and an interconnection 85 for signal routing.

The first and second power rails 10 and 20 may be formed in a first metal layer M1, and the third power rail may be formed in a second metal layer M2 formed over the first metal layer M1 in a third direction that is perpendicular to the plane of FIG. 1. The first metal layer M1 may be the lowest metal layer among a plurality of metal layers over the semiconductor substrate during the manufacturing process of an integrated circuit. Therefore, in the first standard cell 40, the first metal layer M1 may be used for forming interconnections for signal routing. In the first standard cell 40, because the third power rail 30 is formed in the second metal layer M2 that is formed over the first metal layer M1, and the interconnections 61, 63 and 65 are formed in the first metal layer M1, the interconnection 63 may pass under the third power rail 30 and may be used for signal routing in the second direction 5. Therefore, in the first standard cell 40, signals may be routed along the second direction 5 as well as along the first direction 3, and thus routability in the first standard cell 40 may be enhanced.

In some embodiments, the first and second power rails 10 and 20 may correspond to a power supply VDD rail, and the third power rail 30 may correspond to a ground GND rail. The impurity regions 41, 43, 47, 71, and 81 may correspond to p-type impurity regions, and the impurity regions 42, 44, 46, 72, and 82 may correspond to n-type impurity regions.

In some embodiments, the first standard cell 40 may have a flip configuration with respect to the third power rail 30. The first standard cell 40 may encompass more circuit area and routing resources than each of the second standard cells 70 and 80, and thus the first standard cell 40 may be used for implementing more complex functions. Therefore, a circuit designer may implement functions in the first standard cell 40 that cannot be implemented in the second standard cells 70 and 80, and thus the designer may have more margins for designing the integrated circuit.

Figure 2:
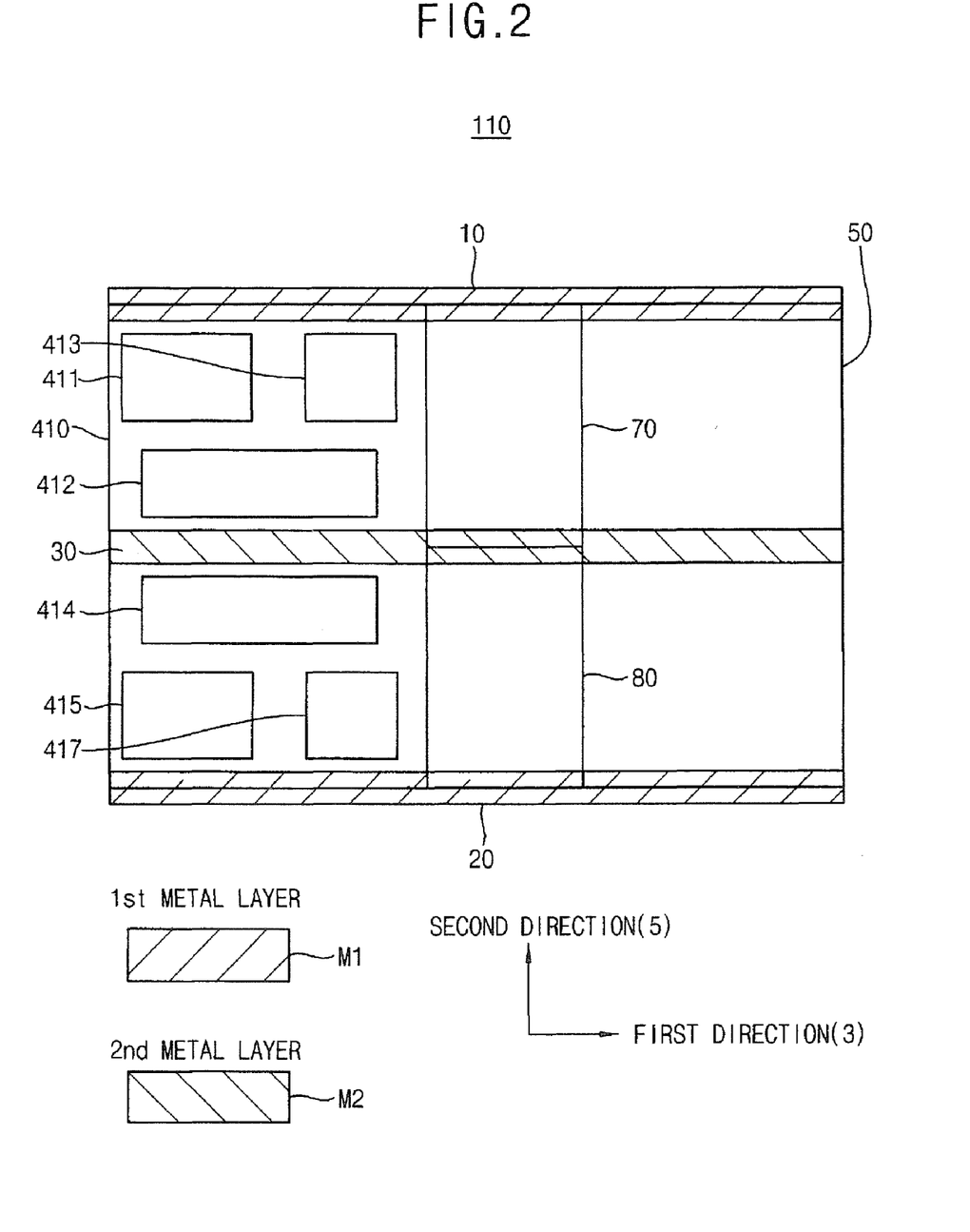
FIG. 2 illustrates a standard cell library according to further embodiments.

FIG. 2 illustrates a standard cell library according to further embodiments.

Referring to FIG. 2, a standard cell library 110 according to further embodiments includes a first power rail 10, a second power rail 20, a third power rail 20, first standard cells 410 and 50, and second standard cells 70 and 80.

The standard cell library 110 of FIG. 2 has a similar configuration as the standard cell library 100 of FIG. 1 except that the first standard cell 410 has a layout that is symmetric with respect to the third power rail 30. In the standard cell library 110 of FIG. 2, poly gates and interconnections are not illustrated for convenience of explanation.

Figure 3:
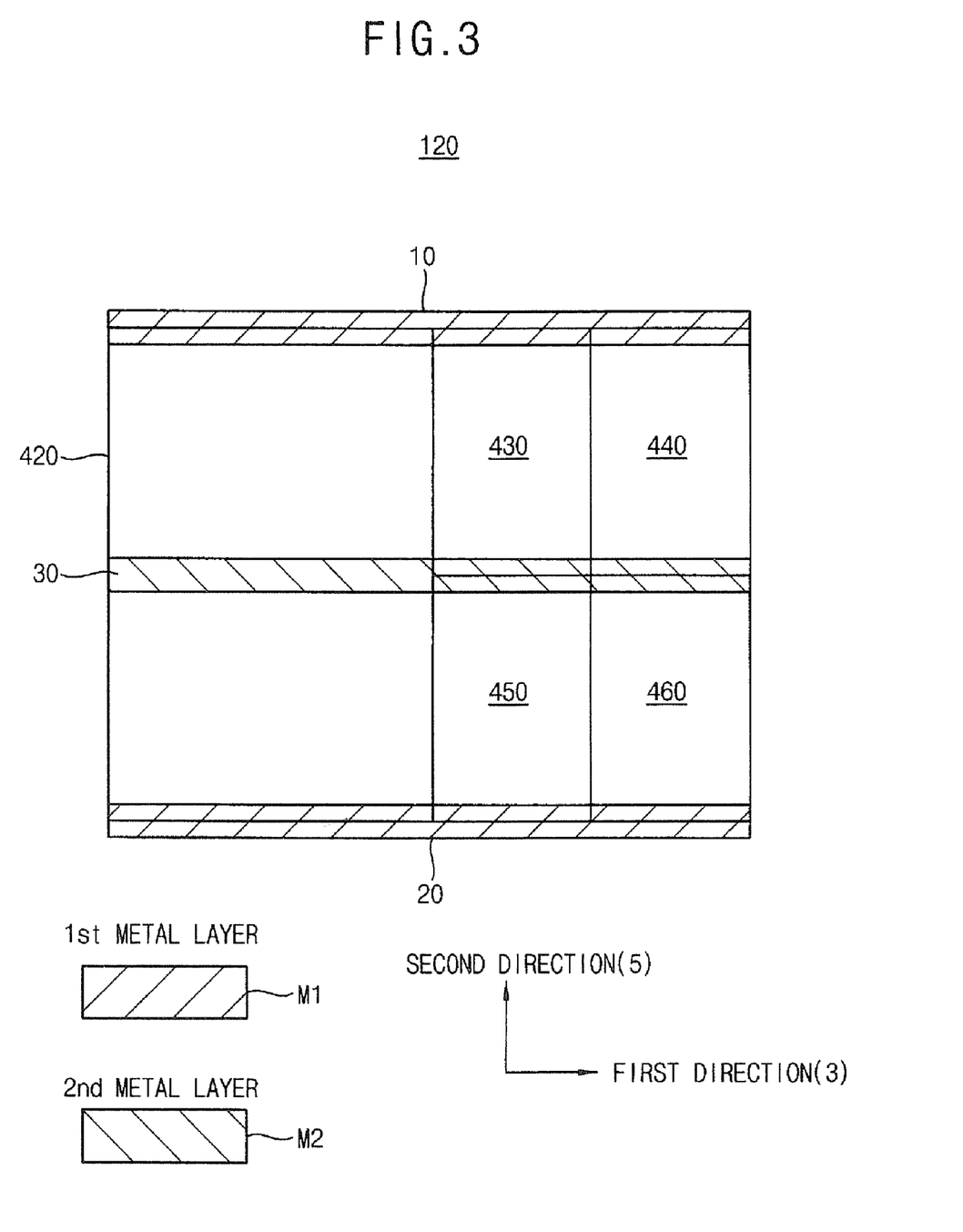
FIG. 3 illustrates a standard cell library according to further embodiments.

FIG. 3 illustrates a standard cell library according to still further embodiments.

Referring to FIG. 3, a standard cell library 120 according to further embodiments includes a first power rail 10, a second power rail 20, a third power rail 30, a first standard cell 420, and second standard cells 430, 440, 450 and 460.

The second standard cells 430 and 450 are arranged in contact with the first standard cell 420 in the first direction 3, and the second standard cells 430 and 450 are arranged in contact with one another in the second direction 5. The second standard cells 440 and 460 are arranged in contact with the second standard cells 430 and 450 in the first direction 3, and the second standard cells 440 and 460 are arranged in contact with one another in the second direction 5. The first, second and third power rails 10, 20 and 30, the first standard cell 420 and the second standard cells 430, 440, 450 and 460 of FIG. 3 may have layouts similar to the first, second third power rails 10, 20 and 30, the first stand cell 40 and the second standard cells 70 and 80 of FIG. 1, respectively.

Figure 4:
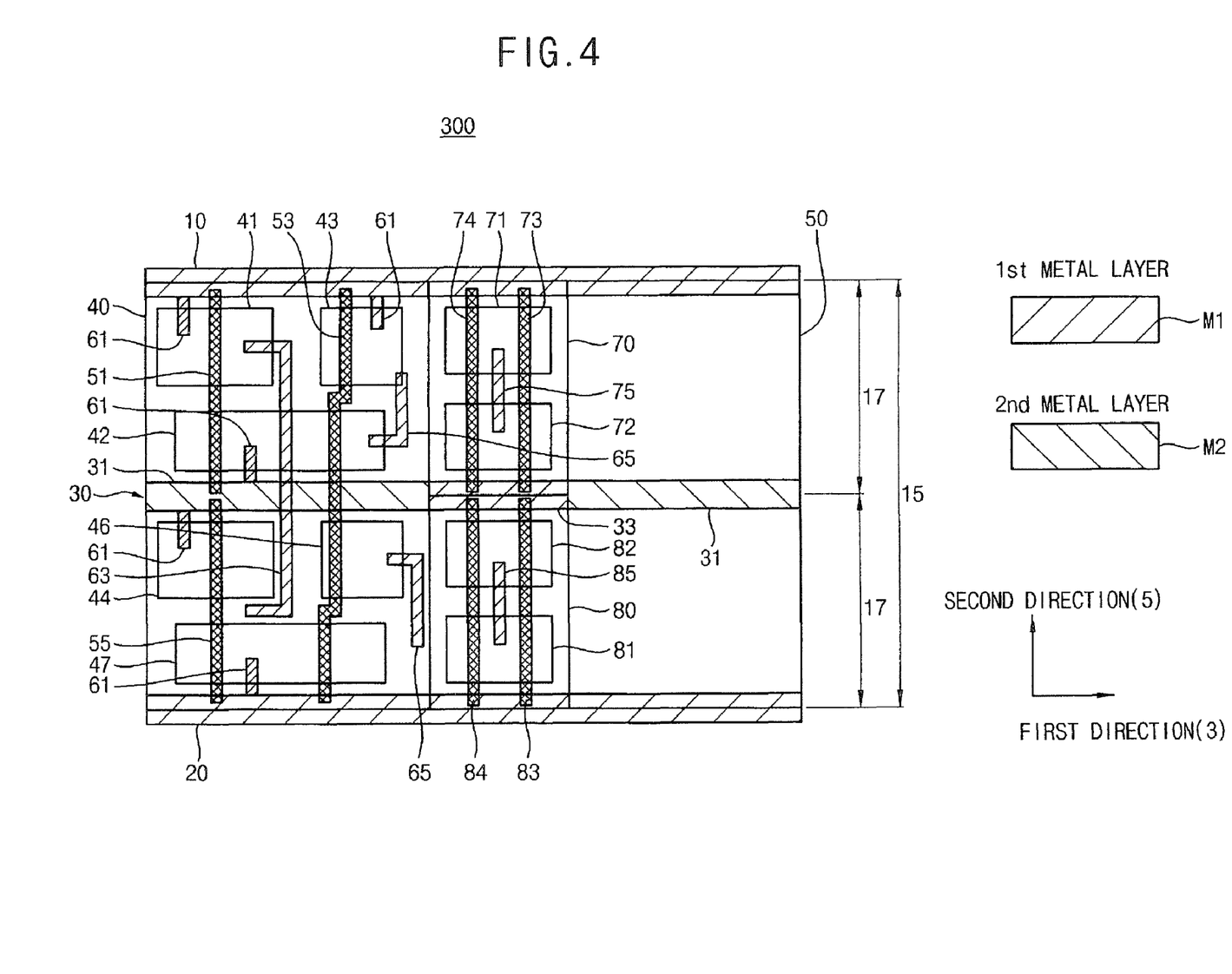
FIG. 4 illustrates a standard cell library according to further embodiments.

FIG. 4 illustrates a standard cell library according to still further embodiments.

Referring to FIG. 4, a standard cell library 300 according to some embodiments includes a first power rail 10, a second power rail 20, a third power rail 30, first standard cells 40 and 50, and second standard cells 70 and 80.

The first power rail 10 extends in a first direction 3. The second power rail 20 extends in the first direction 3 and is spaced apart from the first power rail 10 by a predetermined spacing in a second direction 5. The second direction 5 is perpendicular to the first direction 3. The third power rail 30 extends in the first direction 3 between the first power rail 10 and the second power rail 20. In some embodiments, each of the first and second power rails 10 and 20 may be spaced apart from the third power rail 30 by the same spacing.

The first standard cell 40 is arranged between the first and the second power rails 10 and 20, and the first standard cell 40 has a first cell height 15. The cell height indicates a horizontal length of the cell in the second direction 5. The second standard cells 70 and 80 are arranged between the first and the second power rails 10 and 20, and the second standard cells 70 and 80 are in contact with the first standard cell in the first direction 3. The second standard cells 70 and 80 are in contact with each other in the second direction 5. The second standard cells 70 and 80 respectively have a second cell height 17. In some embodiments, each of the second standard cells 70 and 80 may have a cell height of seven tracks, and thus, the first standard cell 40 may have a cell height of fourteen tracks. The first standard cell 50 may be arranged in contact with the second standard cells 70 and 80 in the first direction 3.

The first standard cell 40 includes a plurality of impurity regions 41, 42, 43, 44, 46, and 47 that are formed apart from one another in a semiconductor substrate between the first and second power rails 10 and 20 and includes a plurality of poly gates 51, 53 and 55 that partition the impurity regions 41, 42, 43, 44, 46, and 47. The poly gate 53 may pass under the third power rail 30. Transistors (that is, combinations of a drain, a source and a gate forming a transistor) may be defined by the impurity regions 41, 42, 43, 44, 46, and 47 and the poly gates 51, 53 and 55. The first standard cell may further include interconnections 61, 63 and 65 for signal routing. The interconnection 61 may connect the power rails 10, 20 and 30 with the impurity regions 41, 42, 43, 44, 46, and 47, respectively, as illustrated in FIG. 1.

The second standard cell 70 includes impurity regions 71 and 72, poly gates 73 and 74 and an interconnection 75 for signal routing. The second standard cell 80 includes impurity regions 81 and 82, poly gates 83 and 84 and an interconnection 85 for signal routing.

In comparison with the standard cell library 100 of FIG. 1 in which the entire portion of the third power rail 30 is formed in the second metal layer M2, FIG. 4 illustrates a standard cell library 300 in which some portions of the third power rail 30 are formed in the second metal layer M2 and other portions of the third power rail 30 are formed in the first metal layer M1.

The first and second power rails 10 and 20 may be formed in a first metal layer M1, and the third power rail 30 may include a first portion 31 over the first standard cells 40 and 50, and a second portion 33 over the second standard cells 70 and 80. The first metal layer M1 may be the lowest metal layer among a plurality of metal layers formed over the semiconductor substrate during manufacturing process of an integrated circuit. The second portion 33 may be formed in the first metal layer M1 and the first portion 31 may be formed in a second metal layer M2 formed over the first metal layer M1. Therefore, in the first standard cell 40, the first metal layer M1 may be used for forming interconnections for signal routing. In the first standard cell 40, because the third power rail 30 is formed in the second metal layer M2 that is formed over the first metal layer M1, and the interconnections 61, 63 and 65 are formed in the first metal layer M1, the interconnection 63 may pass under the third power rail 30 and may be used for signal routing in the second direction 5. Therefore, in the first standard cell 40, signals may be routed along the second direction 5 as well as along the first direction 3, and thus routability in the first standard cell 40 may be enhanced.

In some example embodiments, the first and second power rails 10 and 20 may correspond to a power supply VDD rail, and the third power rail 30 may correspond to a ground GND rail. The impurity regions 41, 43, 47, 71, and 81 may correspond to p-type impurity regions, and the impurity regions 42, 44, 46, 72, and 82 may correspond to n-type impurity regions.

In some example embodiments, the first standard cell 40 may have a flip configuration with respect to the third power rail 30. The first standard cell 40 may encompass more circuit area and routing resources than each of the second standard cells 70 and 80, and thus the first standard cell 40 may be used for implementing more complex functions. Therefore, a circuit designer may implement functions using the first standard cell 40 that cannot be implemented by the second standard cells 70 and 80, and thus the designer may have more margins for designing the integrated circuit.

Figure 5:
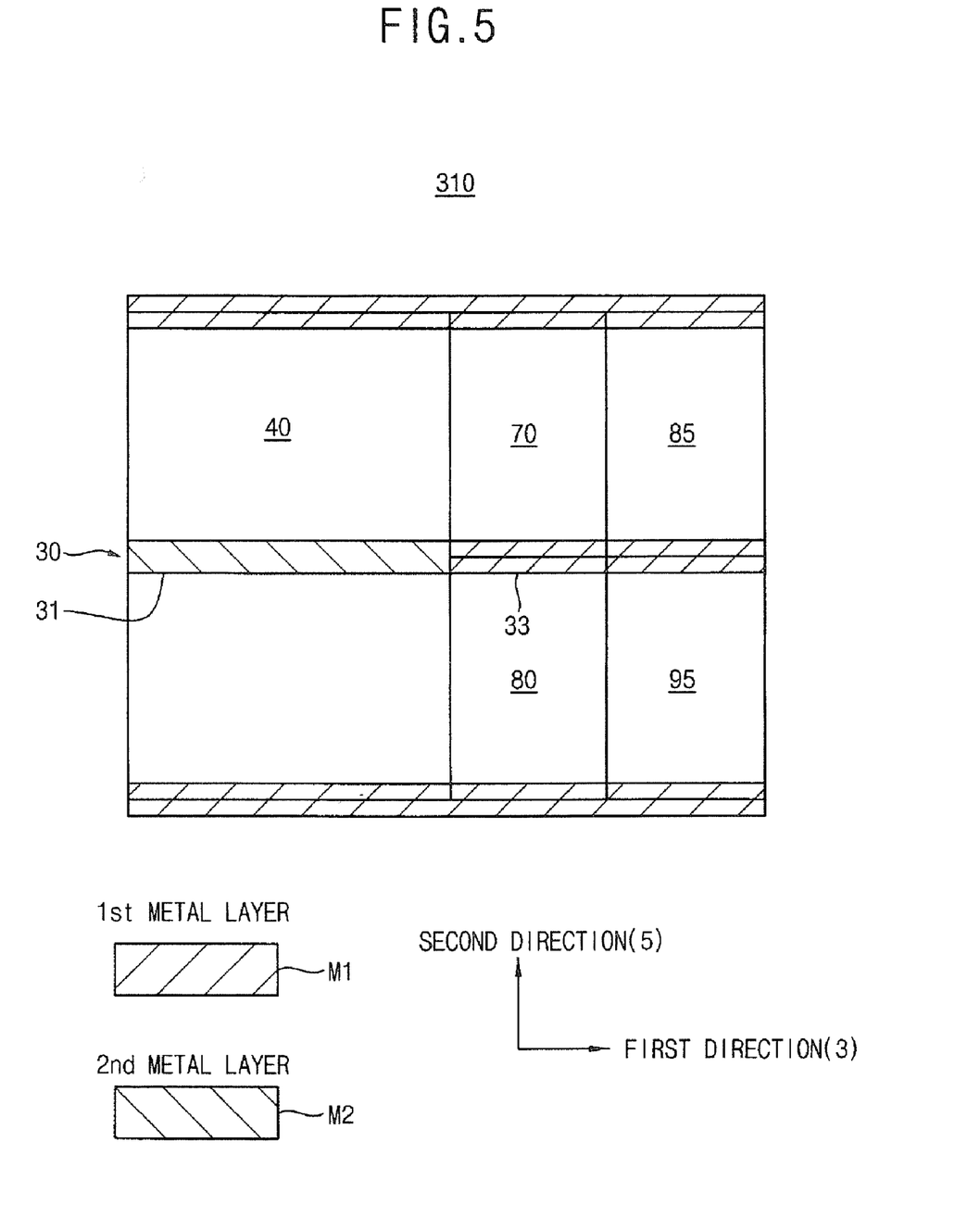
FIG. 5 illustrates a standard cell library according to further embodiments.

FIG. 5 illustrates a standard cell library according to further embodiments.

Referring to FIG. 5, a standard cell library 310 according to some embodiments may include second standard cells 85 and 95 that are in contact with the second standard cells 70 and 80 in the first direction 3. The second standard cells 85 and 95 are in contact with each other in the second direction 85 and 95.

In the standard cell library 310 of FIG. 5, the first power rail 10 and the second power rail 20 may be formed in the first metal layer M1, and the third power rail 30 may include a first portion 31 over the first standard cells 40 and 50, and a second portion 33 over the second standard cells 70, 80, 85 and 90. The second portion 33 may be formed in the first metal layer M1 and the first portion 31 may be formed in a second metal layer M2 formed over the first metal layer M1.

Figure 6:
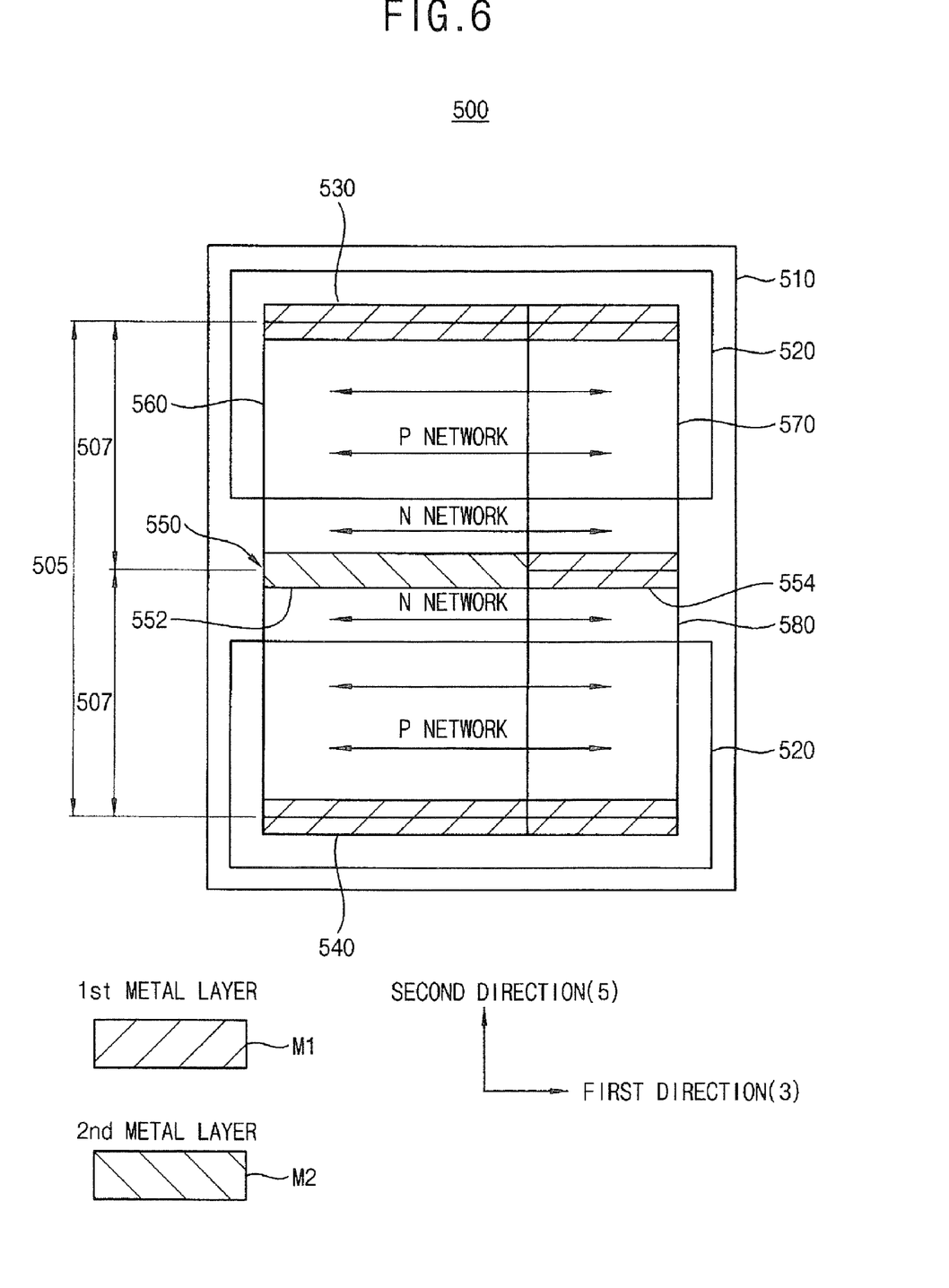
FIG. 6 illustrates an integrated circuit (IC) according to some embodiments.

FIG. 6 illustrates an integrated circuit (IC) according to some embodiments.

Referring to FIG. 6, an IC 500 according to some embodiments includes a first standard cell 560 having a first cell height 505 and second standard cells 570 and 580 having a second cell height 507. The first standard cell 560 and the second standard cells 570 and 580 are formed in/on a semiconductor substrate 510. For example, active regions forming a drain and a source of a transistor may be formed in the semiconductor substrate 510 and a gate of transistor and signal routing connections may be formed on the semiconductor substrate 510

The IC 500 includes a first power rail 530, a second power rail 540 and a third power rail 550. The first power rail 530 extends in a first direction 3 on the semiconductor substrate 510. The second power rail 540 extends in the first direction 3 and is spaced apart from the first power rail 10 by a predetermined spacing in a second direction 5 on the semiconductor substrate 510. The second direction 5 is perpendicular to the first direction 3. The third power rail 550 extends in the first direction 3 between the first power rail 510 and the second power rail 540 on the semiconductor substrate 510. In some embodiments, each of the first and second power rails 530 and 540 may be spaced apart from the third power rail 550 by the same spacing. The first standard cell 560 is arranged between the first and the second power rails 530 and 540, and the first cell height 505 of the first standard cell 560 may be defined by the first and second power rails 530 and 540. The second standard cells 570 and 580 are arranged between the first and the second power rails 530 and 540, and are in contact with the first standard cell 560 in the first direction 3. The second standard cells 570 and 580 are in contact with each other in the second direction 5. The second cell height 507 of the second standard cells 570 and 580 may be defined by a spacing between the or the first and third power rails 530 and 550 and/or between the second and third power rails 540 and 550. In some embodiments, each of the second standard cells 570 and 580 may have a cell height of seven tracks, and thus, the first standard cell 540 may have a cell height of fourteen tracks.

In some example embodiments, when the semiconductor substrate 510 is p-type, at least one N-well 520 is formed on the semiconductor substrate 510, p-type impurity regions P-network are formed in the N-well 520, and n-type impurity regions N-network are formed in the semiconductor substrate 510 where the N-well 520 is not formed. In some embodiments, the first and second power rails 530 and 540 may correspond to a power supply rail, and the third power rail 550 may correspond to a ground rail. The third power rail 550 may include a first portion 552 over the first standard cell 560 and a second portion 554 over the second standard cells 570 and 580. The first power rail 530 and the second power rail 540 may be formed in the first metal layer M1. The first portion 552 of the third power rail 550 may be formed in the second metal layer M2, and the second portion 554 of the third power rail 550 may be formed in the first metal layer M1. Therefore, in the first standard cell 560, the first metal layer M1 may be used for signal routing. In addition, in the first standard cell 560, the third power rail 550 may be formed in the second metal layer M2, and the interconnections (not illustrated) for signal routing may be formed in the first metal layer M1 by passing under the third power rail 550. Therefore, signals may be routed along the second direction 5 as well as along the first direction 3, and thus routability in the first standard cell 560 may be enhanced. In some example embodiments, both of the first and second portions 552 and 554 of the third metal layer 550 may be formed in the second metal layer M2. The standard cell libraries of FIGS. 1 through 5 may be employed in the IC 500 of FIG. 6.

Figure 7:
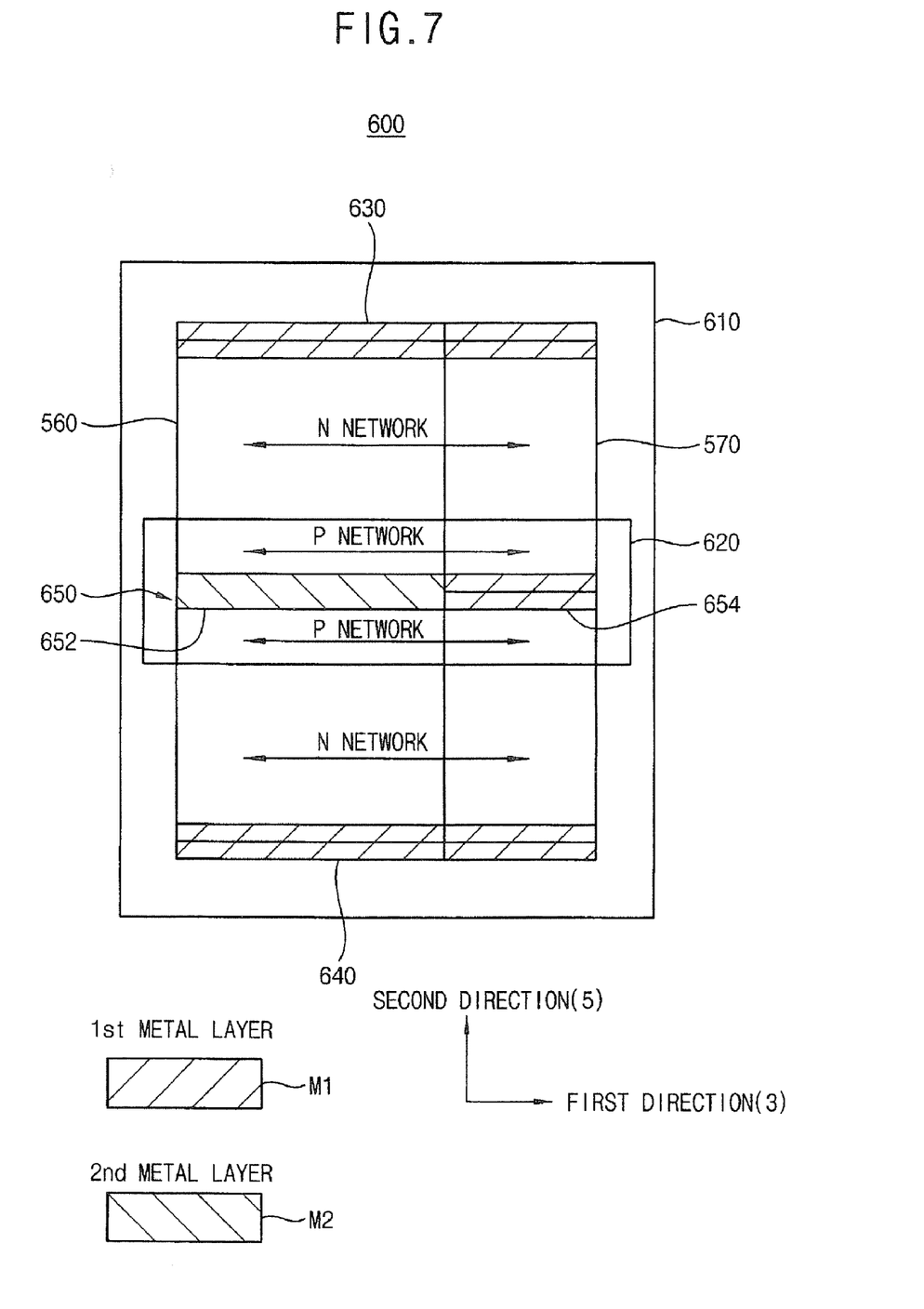
FIG. 7 illustrates an IC according to further embodiments.

FIG. 7 illustrates an IC according to further embodiments.

Referring to FIG. 7, an IC 600 according to some embodiments includes a semiconductor substrate 610, a first power rail 630, a second power rail 640, a third power rail 650, a first standard cell 660, and a second standard cells 670 and 680. The IC 600 of FIG. 7 has a similar configuration as a configuration of the IC 500 of FIG. 6 except that the N-well is formed where the third power rail 650 extends on the semiconductor substrate 610. The third power rail 650 may include a first portion 652 over the first standard cell 660 and a second portion 654 over the second standard cells 670 and 680 as explained with reference to FIG. 6. In addition, the first portion 652 of the third power rail 650 may be formed in the second metal layer M2 and the second portion 654 of the third power rail 650 may be formed in the first metal layer M1. In some embodiments, both of the first and second portions 652 and 654 of the third metal layer 650 may be formed in the second metal layer M2.

As described above, a first standard cell of at least one cell having a first cell height and second standard cells of at least two cells having a second cell height different from the first cell height are arranged in contact with one another between first, second and third power rails, all of which extend in a same direction. A second metal layer M2 is used for the third power rail between the first and second power rails. Therefore, cells having complex functions may be implemented due to the improved routability in a highly integrated cell architecture. An area for the first metal layer M1 is reserved because of a enhanced routability of the first metal layer M1, and thus, a design margin may be additionally reserved, and/or yields may be increased. Therefore, many mobile devices may employ a standard cell library as described herein and integrated circuits employing such standard cell libraries.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A standard cell library comprising:
a first power rail extending in a first direction;
a second power rail extending in the first direction, the second power rail being spaced apart from the first power rail by a predetermined spacing in a second direction that is perpendicular to the first direction;
a third power rail extending in the first direction between the first power rail and the second power rail;
at least one first standard cell having a first cell height in the second direction, the first standard cell being arranged between the first power rail and the second power rail and being electrically connected to the third power rail; and
at least two second standard cells, each second standard cell having a second cell height in the second direction and arranged between the first power rail and the second power rail, the second standard cells being in contact with each other in the second direction and being in contact with the first standard cell in the first direction;
wherein the first standard cell uses a first metal layer for signal routing between impurity regions, wherein the first metal layer comprises a lowest metal layer in the standard cell library and wherein the first and second power rails are formed in the first metal layer; and
wherein the third power rail is connected to the first standard cell and the at least two second standard cells and wherein at least a portion of the third power rail is formed in a second metal layer that is above the first metal layer.

2. The standard cell library of claim 1, wherein the first standard cell includes a plurality of impurity regions and a plurality of poly gates, the impurity regions being spaced apart from one another in regions between the first and second power rails, and the poly gates dividing the impurity regions.

3. The standard cell library of claim 2, wherein at least one of the poly gates passes under the third power rail.

4. The standard cell library of claim 3, wherein the impurity regions are formed in a flip configuration with respect to the third power rail.

5. The standard cell library of claim 3, wherein the impurity regions are formed in a symmetric configuration with respect to the third power rail.

6. The standard cell library of claim 1, wherein each of the second standard cells includes a plurality of impurity regions and a plurality of poly gates, the impurity regions being spaced apart from one another in a region between the first and third or second and third power rails, and the poly gates dividing the impurity regions.

7. The standard cell library of claim 1, wherein the third power rail includes a first portion over the first standard cell and a second portion over the second standard cells, the first portion being formed in a second metal layer that is above the first metal layer, and the second portion being formed in the first metal layer.

8. The standard cell library of claim 1, wherein the first and second power rails comprise power supply rails, and the third power rail comprises a ground rail.

9. The standard cell library of claim 1, wherein the first and second power rails comprise a ground rail, and the third power rail comprises a power supply rail.

10. A standard cell library including at least one first standard cell having a first cell height and at least two second standard cells, each second standard cell having a second cell height, the standard cell library comprising:
a first power rail extending in a first direction;
a second power rail extending in the first direction, the second power rail being spaced apart from the first power rail in a second direction that is perpendicular to the first direction; and
a third power rail extending in the first direction between the first power rail and the second power rail;
the first standard cell arranged between the first power rail and the second power rail, the first cell height being defined by a spacing between the first and second power rails, and being electrically connected to the third power rail;
the second standard cells being arranged between the first power rail and the second power rail, in contact with each other in the second direction and being in contact with the first standard cell in the first direction, the second cell height being defined by a spacing between the first and third power rails or by a spacing between the third and second power rails;

wherein the first standard cell uses a first metal layer for signal routing between impurity regions, wherein the first metal layer comprises a lowest metal layer in the standard cell library and wherein the first and second power rails are formed in the first metal layer; and wherein the third power rail is connected to the first standard cell and the at least two second standard cells and wherein at least a portion of the third power rail is formed in a second metal layer that is above the first metal layer.

11. The standard cell library of claim 10, wherein the third power rail includes a first portion over the first standard cell and a second portion over the second standard cells, the first portion being provided in the second metal layer, the second portion being provided in the first metal layer.

12. An integrated circuit (IC) including at least one first standard cell having a first cell height and at least two second standard cells, each second standard cell having a second cell height, the first standard cell and the second standard cells being formed on a substrate of the IC, the IC comprising:

a first power rail extending in a first direction over the substarte;

a second power rail extending in the first direction, the second power rail being spaced apart from the first power rail by a predetermined spacing in a second direction perpendicular to the first direction; and a third power rail extending in the first direction between the first power rail and the second power rail;

the first standard cell being arranged between the first power rail and the second power rail, the first cell height being defined by a spacing between the first and second power rails;

the second standard cells being arranged between the first power rail and the second power rail, in contact with each other in the second direction and being in contact with the first standard cell in the first direction, the second cell height being defined by a spacing between the first and third power rails or by a spacing between the third and second power rails;

wherein the first standard cell uses a first metal layer for signal routing between impurity regions, wherein the first metal layer comprises a lowest metal layer in the standard cell library and wherein the first and second power rails are formed in the first metal layer; and wherein the third power rail is connected to the first standard cell and the at least two second standard cells and wherein at least a portion of the third power rail is formed in a second metal layer that is above the first metal layer.

13. The IC of claim 12, wherein the first and second power rails comprise a power supply rail, and the third power rail comprises a ground rail.

14. The IC of claim 12, wherein the first and second power rails comprise a ground rail, and the third power rail comprises a power supply rail.

15. The IC of claim 12, wherein the third power rail includes a first portion over the first standard cell and a second portion over the second standard cells, the first portion being provided in a second metal layer, and the second portion being provided in the first metal layer.

* * * * *